United States Patent [19]
Mitchell et al.

[11] Patent Number: 6,054,340
[45] Date of Patent: Apr. 25, 2000

[54] METHOD FOR FORMING A CAVITY CAPABLE OF ACCESSING DEEP FUSE STRUCTURES AND DEVICE CONTAINING THE SAME

[75] Inventors: Joel Mitchell, Austin; Fred Cumplan, Pflugerville; Gary Pfeffer, Austin, all of Tex.

[73] Assignee: Motorola, Inc., Schaumburg, Ill.

[21] Appl. No.: 08/870,286

[22] Filed: Jun. 6, 1997

[51] Int. Cl.[7] .................................................. H01L 21/82
[52] U.S. Cl. ......................... 438/132; 438/601; 438/700; 257/529
[58] Field of Search ..................................... 438/612, 624, 438/694, 699, 700, 702, 717, 735, 736–744, 958

[56] References Cited

U.S. PATENT DOCUMENTS

| | | |
|---|---|---|
| 4,618,878 | 10/1986 | Aoyama et al. . |
| 4,977,105 | 12/1990 | Okamoto et al. ...................... 437/190 |
| 5,091,762 | 2/1992 | Watanabe ................................ 357/23.6 |
| 5,116,776 | 5/1992 | Chan et al. ................................ 437/52 |
| 5,204,286 | 4/1993 | Doan ........................................ 437/195 |
| 5,262,352 | 11/1993 | Woo et al. ................................ 437/189 |
| 5,397,743 | 3/1995 | Jun et al. . |
| 5,439,840 | 8/1995 | Jones et al. ................................ 437/52 |
| 5,578,517 | 11/1996 | Yoo et al. . |
| 5,759,906 | 6/1998 | Lou . |
| 5,821,160 | 10/1998 | Rodriguez et al. . |
| 5,879,966 | 3/1999 | Lee et al. . |
| 5,891,762 | 4/1999 | Sakai et al. . |

*Primary Examiner*—John F. Niebling
*Assistant Examiner*—Jonathan Hack

[57] ABSTRACT

A method for forming a cavity (30) to a structure such as a poly fuse (114) with a deep etch process whereby a mask is formed over the structure a first dielectric layer (23) and an etch partially through the first dielectric layer is performed. Next, a second dielectric layer (34) is deposited and a second mask is formed for completing the etch to the structure. Finally, an etch through the second dielectric (34) to an area at or near the structure is performed. A resultant device has non-etched second dielectric material on the sidewalls of the etch cavity 30.

20 Claims, 5 Drawing Sheets

METHOD FOR FORMING A CAVITY CAPABLE OF ACCESSING DEEP FUSE STRUCTURES AND DEVICE CONTAINING THE SAME

FIELD OF THE INVENTION

The present invention relates generally to the processing of semiconductor devices, and more specifically to etching through a passivation layer onto a semiconductor device.

BACKGROUND OF THE INVENTION

Modern semiconductor devices such as memory devices are known to use fuses in order to increase the yield obtained through modern semiconductor processing techniques. By providing fuses in semiconductor devices, such as memories, where redundancy is built in, it is possible to increase the yield by identifying defects in the device and replacing this defective circuitry with redundant circuitry by blowing fuses. In modern semiconductor technology this has been one with the use of both polysilicon (poly) fuses and metal fuses.

Metal fuses are formed in any one of a number of metal layers of a semiconductor device. For example, referring to FIG. 1, there are three metal interconnect layers indicated. Metal interconnects 118, 120, and 122 are illustrated to reside at these three layers. This device would be referred to as a triple layer metal device. In one type of fuse technology, a fuse is formed at the second layer of metal which can be then blown selectively by a laser operation during a testing and configuration stage. Note, that a metal fuse is not shown at the second metal layer in FIG. 1, however it would reside effectively at the same level as the metal interconnect line 120, which is illustrated.

A known problem with the use of metal fuses is that the integrity of the blown fuse can be questionable. This integrity issue arises from the physical reaction of the metal fuse to the laser energy, and the material mechanics subsequent to this reaction. The laser energy melts the metal to a liquid state, and ideally, this melted metal flows away from the spot where the laser impacted the fuse. Often, the metal will not separate sufficiently to cause a complete electrical disconnect, or the melted metal may re-flow into the void generated by the laser, allowing an electrical connection to be reformed. This mechanism causes the repair to be ineffective and the specific device being repaired will not function as intended.

The use of poly silicon (poly) fuses has been utilized in order to overcome some of the issues associated with metal fuses. Specifically, poly vaporizes when exposed to laser light, thereby eliminating many of the problems associated with the use of metal fuses. The use of poly fuses has been successful where single and double layers of metal have been used. However, where a triple layer metal process has been used, as illustrated in FIG. 1, the use of poly fuses presents its own set of problems because it is at a lower layer in the semiconductor device process and flow. For example, as illustrated in FIG. 1, there can be four or more dielectric layers above the layer which the poly fuse 114 resides. As a result, the challenge is to etch down to expose the poly fuse 114, without damaging any other portions of the device during the etch.

One problem that occurs during a deep etch process is illustrated in FIG. 1 and FIG. 2. Following the formation of the three metal layers, a passivation layer 134 is formed atop the semiconductor device. Next, a combined fuse and die pad mask is used in order to expose the third, or top layer of metal. Specifically, the top layer of metal is generally used to form die pads 124 as well as the openings necessary to expose the poly fuse 114. Because of the mismatch in depth between where the fuse resides with relationship to the surface and where the die pad 124 resides with relationship to the surface, a reliability problem exists. Note that by the time the etch process reaches the fuse 114, so that it can be accessed by a laser, the photoresist mask 136 has been etched away such that the passivation layer 134 has been etched below metal interconnect structure 122 (FIG. 2) which it is meant to protect. Therefore, there is no passivation over this structure which in turn causes reliability issues. Therefore, a method allowing for a high reliability etch to polysilicon fuses without causes reliability issues incurred as a result of etching the fuses and bond pads at the same time would be desirable.

DETAILED DESCRIPTION OF THE DRAWINGS

Figure 1:
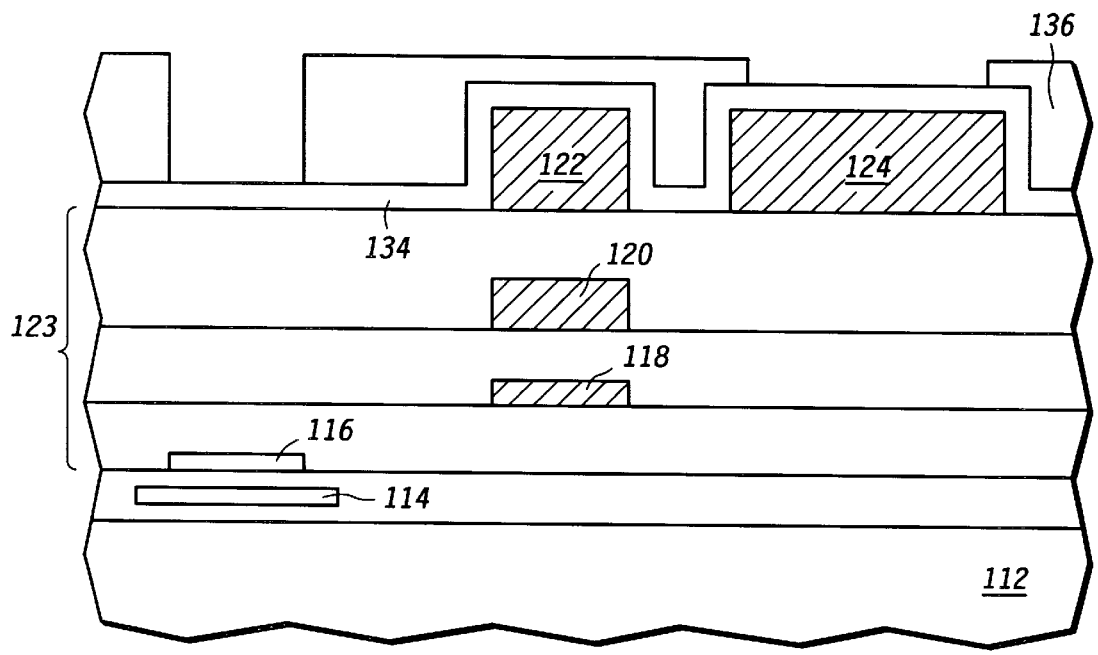
FIG. 1 illustrates in cross-sectional view a semiconductor device formed through the masking of a photoresist layer.
Figure 2:
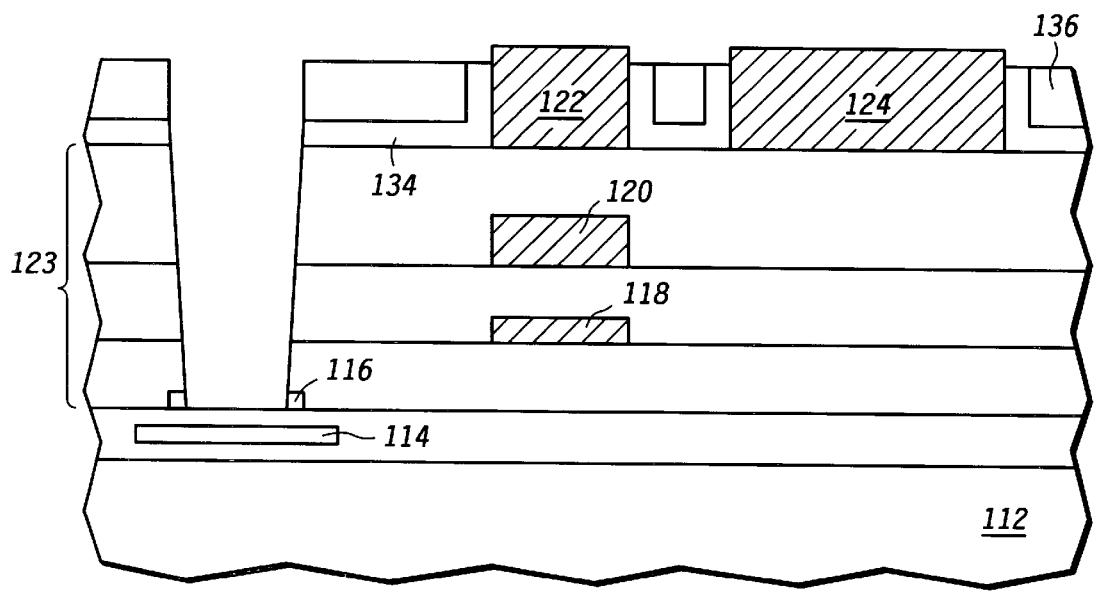
FIG. 2 illustrates the semiconductor device of FIG. 1 following an etch process.
Figure 3:
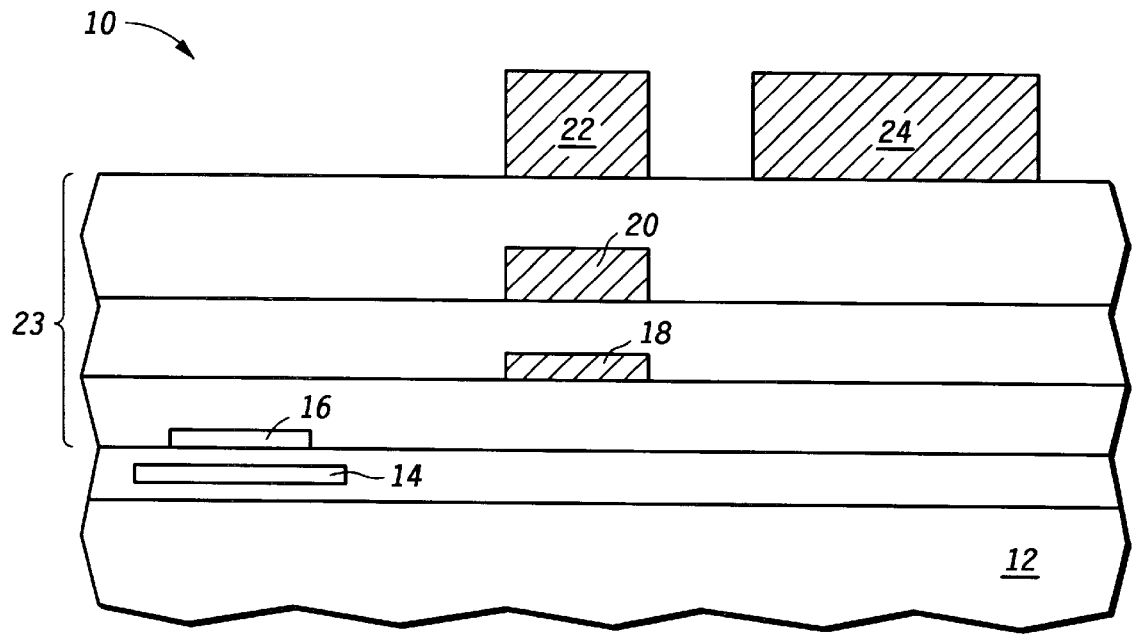
FIG. 3 illustrates in cross-sectional view a semiconductor device in accordance with the present invention processed through the forming of a metal three layer.

The present invention can be best understood with reference to a specific application. FIG. 3 illustrates in cross-sectional view an unfinished semiconductor device 10 which comprises a substrate 12, a fuse poly 14 separated from semiconductor substrate 12 by a dielectric layer, a stop poly 16 separated from the fuse poly by a dielectric layer, a metal one layer 18 separated from the stop poly by a dielectric layer, a metal two layer 20 separated from the metal layer 18 by a dielectric layer, and a metal three layer 22 which is in turn separated from the metal two layer by a dielectric layer. In addition, at the metal three layer, a bond pad 24 is formed. The combination of the dielectric layers separating the structures 14, 16, 18, 20, and 22 in turn form a dielectric stack 23. The structures 18, 20, and 22 can generally be thought of as interconnect metal within the semiconductor device 10. The bond pad 24 would be used for forming an external connection by which the semiconductor device 10 will be electrically operated when completed.

The fuse poly 14 is a structure which can be associated with a memory device such as a fast static RAM which would allow for specific rows or columns of memory cells to be used for deaccessing rows or columns which are determined to be not functional, and for accessing rows and columns to replace the deselected rows or columns. The stop poly structure 16 has no electrical function within the semiconductor device 10. However, the stop poly function is used during processing in order to form an etch barrier to control the etch process.

Generally, the poly fuse 14 will have a thickness in the range of 3,500–5,500 angstroms, while the stop poly will generally have a thickness in the range of 300–700 angstroms. In the case of the fuse poly 14, its thickness will be dependent upon the laser specification used in order to blow the fuse 14 in subsequent programming steps. Additionally, the poly characteristics are based upon other poly structures at the same layer which may or may not have electrical functions associated with them. For example, if the fuse poly 14 were residing at a second layer of poly in the semiconductor device 10, where the first layer of poly is not shown, the second layer of poly may actually be used for interconnect in other portions of the device. If the poly interconnect structures have more stringent requirements than the fuse structure did, the poly thickness could be determined based upon those interconnect requirements. Similarly, the stop poly's thickness will generally be determined by other structures using the poly at the same layer. For example, if poly three interconnect is used, and the stop poly is at the poly three layer, the determining characteristics will generally be specified by the interconnect characteristics because the stop poly itself is merely there as an etch reference.

The dielectric separating the stop poly from the fuse poly will generally be in the range of 3,000–4,000 angstroms. It should be noted, however, that the thickness associated with the individual poly as well as with the dielectric between the poly is not critical to the present invention. In fact, the use of a stop poly and a fuse poly need not necessarily even be present in the present invention which more specifically deals with a deep etch process. If the purpose of a deep etch process through the dielectric layer 23 is not for the purposes of stopping on or near a fuse layer, the existence of the fuse is not necessary. For purposes of discussion, however, the use of the fuse structure device of FIG. 3 is illustrated.

Figure 4:
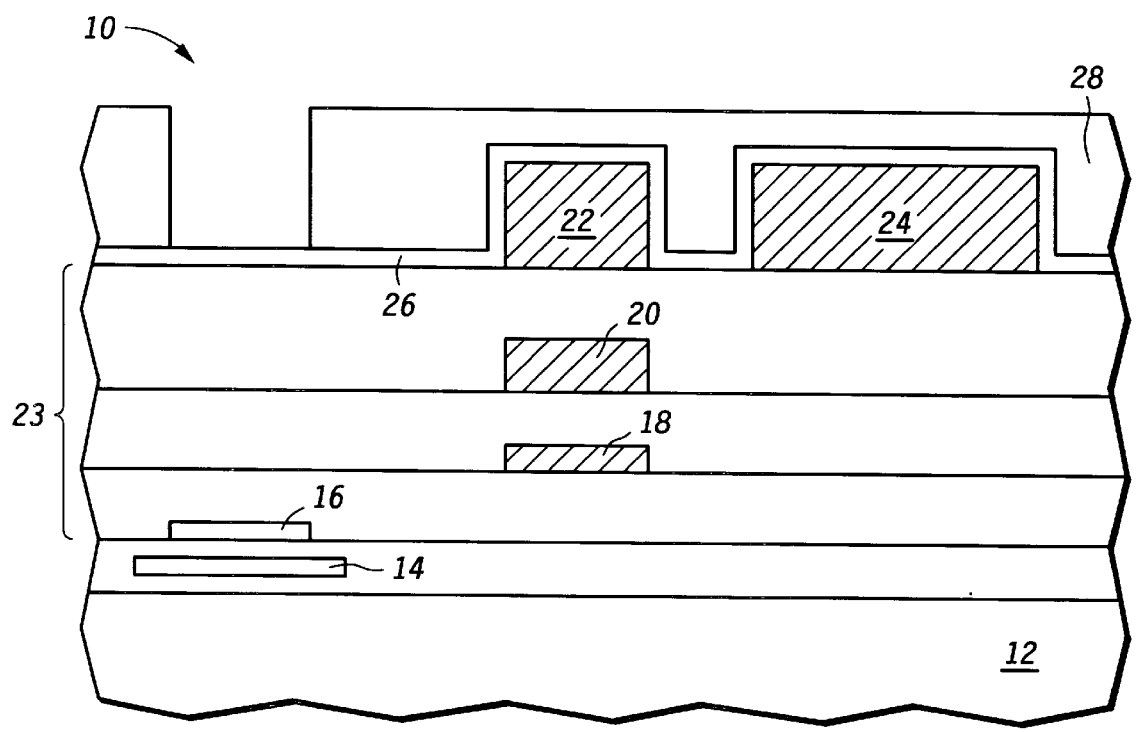
FIG. 4 illustrates the semiconductor device of FIG. 3 following the addition of an oxide layer and a photoresist mask.

FIG. 4 illustrates the semiconductor device of FIG. 3 following the addition of an oxide layer 26 and a photomask layer 28. The oxide layer 26 may be formed of any available isolating oxides, such as a TEOS layer or any other non-conductive film available within the semiconductor processing arts. The oxide layer 26 is applied following the formation of the metal three structures 22 and 24 and protects the structures 22 and 24 from potential contamination of the elements present during the photoresist steps which follow. This isolating barrier is an addition to the process flow from the prior art which utilized only passivation.

Once the metal three structures are isolated by the oxide layer 26, the photoresist mask 28 itself may be formed and patterned as illustrated in FIG. 4 to form an opening which will ultimately define the fuse cavity, where the term "fuse cavity" refers to the opening from the surface of the semiconductor device down toward the fuse itself. Generally, the patterned opening will have a width in the range of 5 microns or greater depending upon the structure being used and its use. Where a fuse is being accessed for purposes of a memory application, the width of the patterned portion of the photoresist layer will generally have a width in the range of 5 to 10 microns with 7 being a typical value. The length associated with the etches associated with accessing fuses may be approximately the same as the width dimension, or considerably longer, depending upon the specific application. At least two distinct differences exist for this photoresist process relative to the prior art. First, only the fuse cavity is patterned at this time. Second, this pattern is applied before the passivation layer is deposited on the device.

Figure 5:
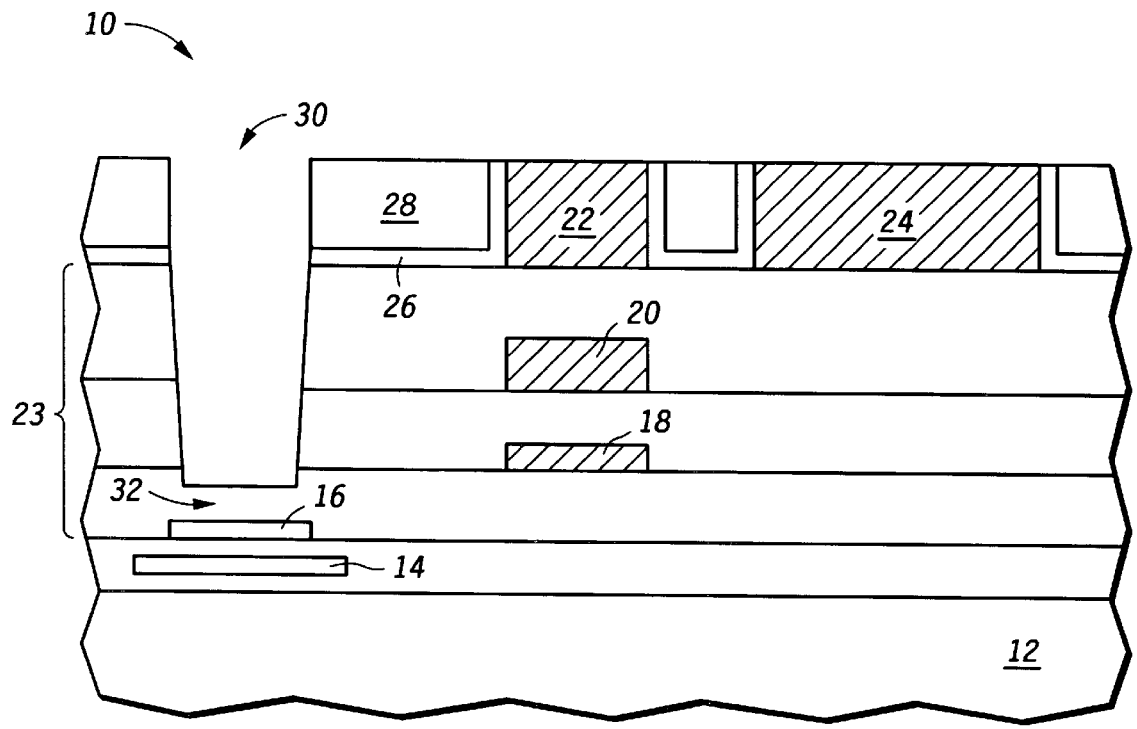
FIG. 5 illustrates the semiconductor device of FIG. 4 following a etching step to partially form a fuse cavity.

Next, FIG. 5 illustrates the semiconductor device 10 following a first etch process. The first etch process is a timed etch process which is timed to stop approximately 1½–2½ microns above the stop poly. As discussed previously, the actual distance at which the first etch process is defined to stop is dependent upon the specific application. In the present application, where a stop poly 16 exists, it is desirable to stop above the stop poly 16 allowing subsequent etch processes to complete this etch part. Where a stop structure does not exist, or possibly no poly structures exist, an initial etch process would be defined to stop at some predefined depth based upon the actual application. Since the actual thickness of the dielectric stack 23 varies across a semiconductor substrate, the point at which an etch process is defined to stop needs to be in a range broad enough to take into account the processing variations which can occur. In the present invention, it is desirable for the first etch to stop prior to reaching the stop poly.

In addition to forming the initial fuse cavity 30, the initial etch process as illustrated in FIG. 5 will also consume a portion of the photoresist 28 and the oxide 26 which resides over the metal line portions, as well as the rest of the semiconductor device. This is illustrated in FIG. 5, where the metal three layer structures 22 and 24 are illustrated to be exposed following this etch process. It should be understood, that due to the non-uniformity of the thickness of the photoresist mask as well as the oxide layer, that the structures associated with the metal three layer may or may not be exposed at all portions of a semiconductor device or substrate. In effect there may be some portions of the metal three layer which are exposed while others are not exposed at all. In another situation, it may be possible for all structures at the metal three layer to be exposed or for none of it to be exposed. For purposes of the present invention, it is not important whether or not the metal three layer is exposed following the initial etch step.

Figure 6:
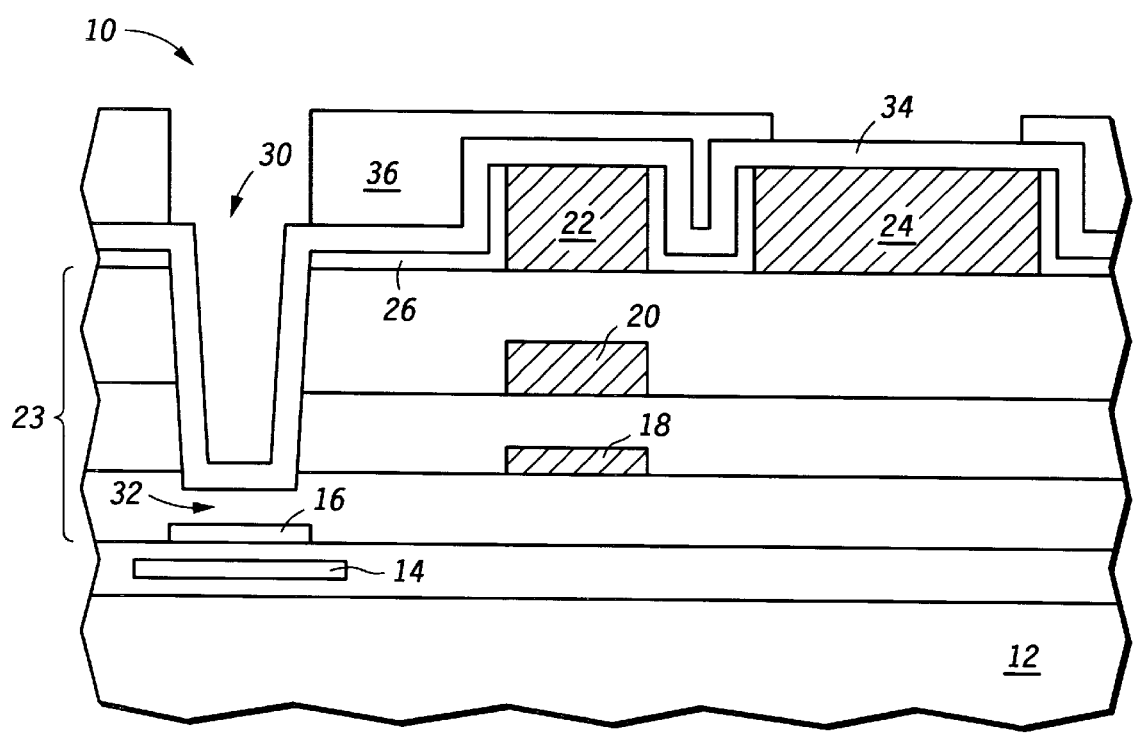
FIG. 6 illustrates in cross-sectional view, the semiconductor device of FIG. 5 following the removal of the photoresist mask, the formation of a passivation region and reapplication of a photoresist mask.

Following the initial etch of FIG. 5, a passivation layer 34 is formed over the semiconductor device 10. This is illustrated in FIG. 6. As further illustrated in FIG. 6, the passivation layer 34 is formed over the metal three structures, the oxide remaining from the previous steps, and into the etch cavity 30. The deposition of the passivation into the now formed etch cavity is a significant change from the prior art. Generally, the passivation layer will be 7,000–13,000 angstroms thick. For example, where silicon oxynitride is used the passivation layer would be approximately 7,000 angstroms thick in one embodiment of the invention. However, where plasma enhanced nitride, polysilicon glass, or other passivating films are used, the overall thickness of the passivation layer, which may comprise several layers, can vary.

Following the formation of the passivation layer, a photoresist layer 36 is formed and patterned. As illustrated in FIG. 6, the photoresist is exposed and developed such that a photoresist mask is formed having openings over the fuse structure 14, and metal three pad structure 24.

Figure 7:
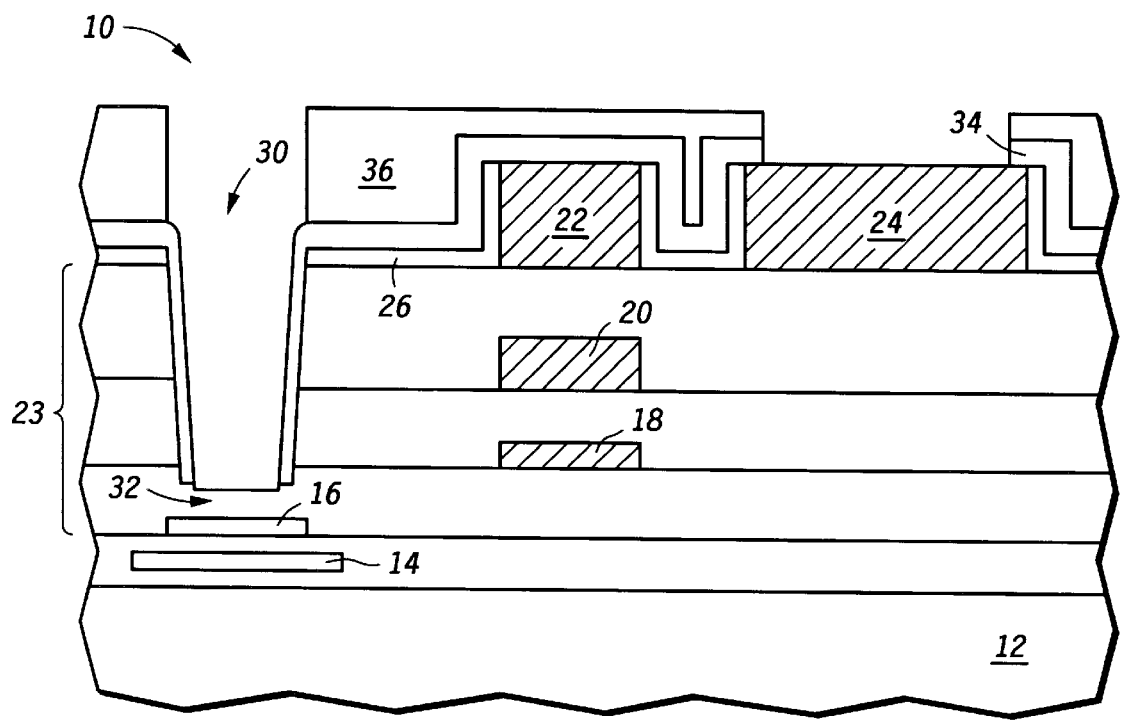
FIG. 7 illustrates the semiconductor device of FIG. 6 following a passivation etch.

FIG. 7 illustrates the unfinished semiconductor device 10 following a passivation etch step. As illustrated, during the passivation etch step, the intent is to remove the portion of the passivation layer 34 which resides under the mask openings for the fuse poly and the metal pads. This etch step, in one embodiment, is a timed etch step that is timed to stop once the passivation layer is calculated to have been removed and at least 70% of multi-layer dielectric 23 over stop poly 16 has been removed. The actual etch step may be completely anisotropically or with a combination of an isotropic and anisotropic etching. With an anisotropic etch, the primary etching would be in a downward direction. However, since the sidewalls of the cavity 30 are going to be slightly tapered as a result of processing constraints the anisotropic etch would remove a portion of the passivation on the sidewall of the cavity. If a combination anisotropic and isotropic etch is used, even more of the sidewall passivation region can be removed.

Whether or not it is necessary for the passivation to remain on the sidewall is going to be application specific. For example, where a fuse opening is being formed as presently being discussed, the presence of the passivation on the sidewall is inconsequential whether it remains or whether it does not remain upon the wall. In other applications, it may be necessary to control the etch such that the isolation provided by the passivation region does exist upon the wall. This step also performs a dual function in that it is an overetch step which assures the bonding pad 24 has been etched such that it does not have any residual visual contaminants upon it.

Figure 8:
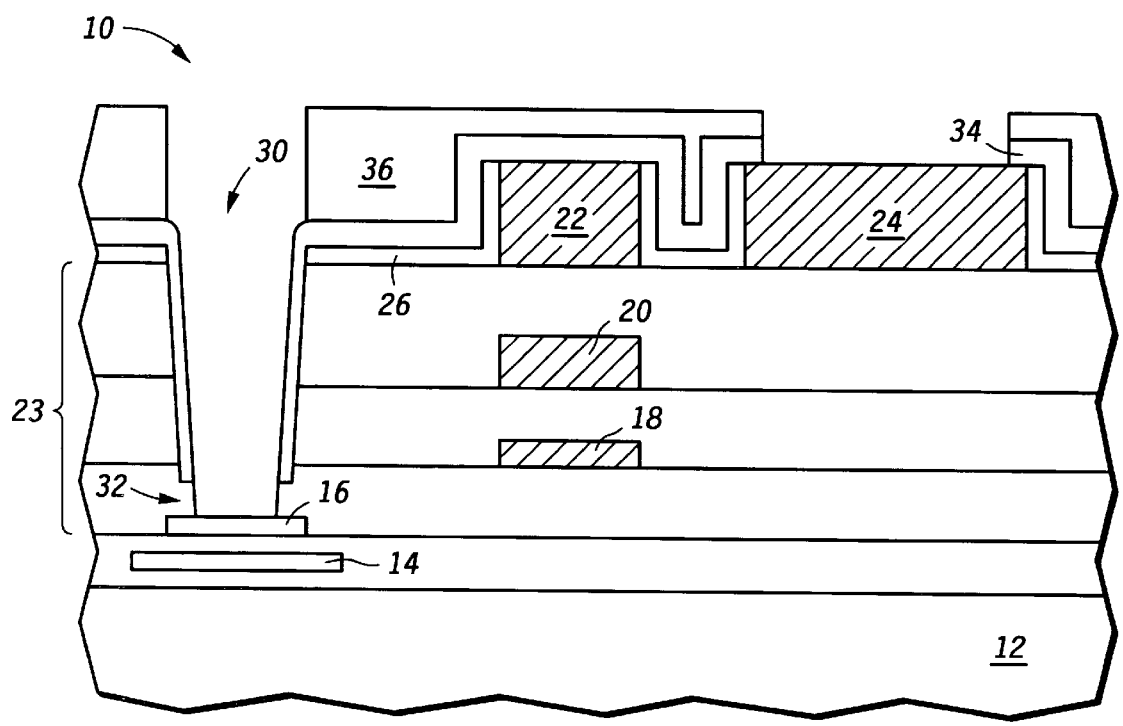
FIG. 8 illustrates the semiconductor device of FIG. 7 following a dielectric etch and bond pad over-etch.

FIG. 8 illustrates the semiconductor device of FIG. 7 following an additional dielectric etch step. The dielectric etch step is selective in that the dielectric layer is preferentially etched as compared to the poly layer, allowing the etch to "stop" on the poly block layer 16. Generally speaking, the selectivity of the etch step will be 20 to 1 such that only insignificant etching of the poly itself will occur. This etch step uses a first etch chemistry to remove layer 34 over bond pad 34 and stop poly 16 and a portion of the remaining portion of layer 23 and a second etch chemistry to achieve etching of the remaining portion of layer 23 to reach stop poly 16.

While FIG. 7 and FIG. 8 are intended to show the sidewall thinner than the sidewall of FIG. 6, FIG. 7 does not accurately illustrate all of the effects of the etch upon the passivation layer 34. Within the cavity 30, it is likely that the passivation layer 34 would be etched away completely where it is illustrated to initially extend beyond the photoresist mask 36. As such, the passivation 34 on the sidewall would begin at a lower level within the cavity 30 than illustrated. This effect will be especially pronounced where an anisotropic etch is used.

Figure 9:
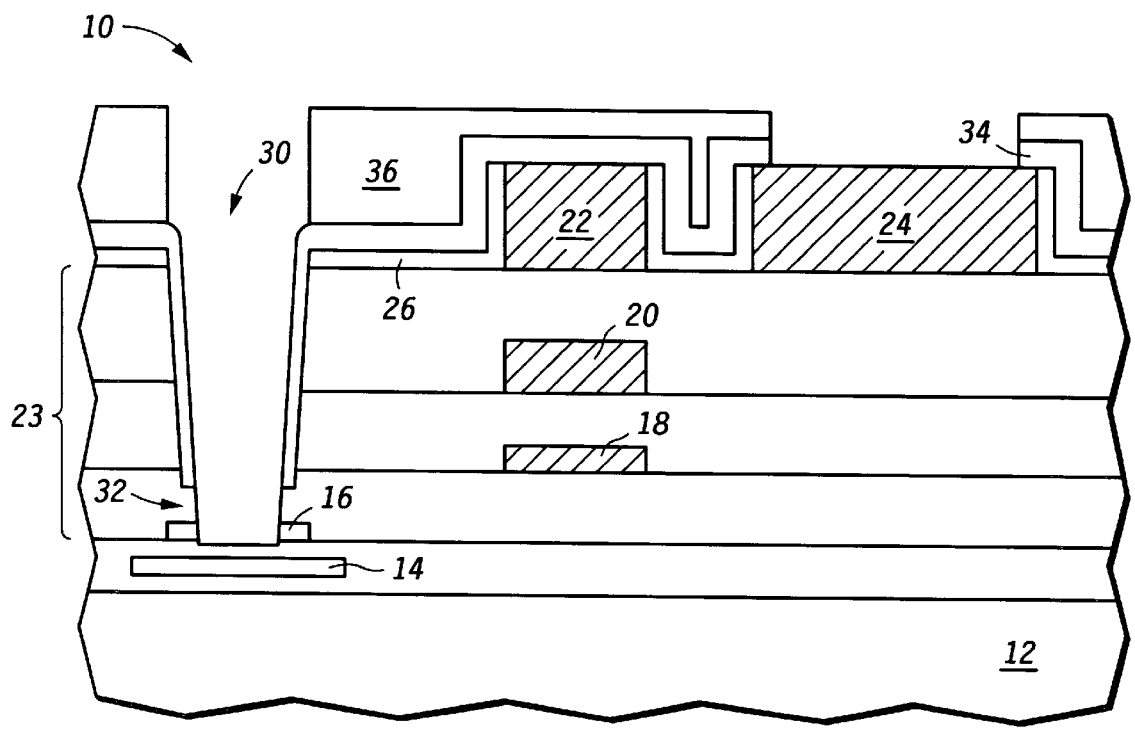
FIG. 9 illustrates in cross-sectional view the semiconductor device of FIG. 8 following a polysilicon etch.

FIG. 9 illustrates the unfinished semiconductor device 10 following a poly etch step. The poly etch step is a timed selective etch. The selectivity of the poly to the dielectric is approximately 3 to 1 and is timed to assure complete etching of the poly stop structure 16. An advantage of the present invention over the prior art is that with the present invention it is assured that a specific cavity depth 30 will be provided uniformly across the semiconductor substrate 12. Without the use of the stop layer, this uniformity could not be assured due to variations in the dielectric stack 23 thickness, as well as in variations that may occur in the etch process itself across the wafer. As a result of the present invention, the poly etch step illustrated in FIG. 9 is relatively easy to control with a timed etch in that the only significant variation can occur with respect of the poly stop layer across the semiconductor device. However, the poly stop layer will have a greater degree of tolerance than the entire dielectric stack 23 as accomplished in the prior art. The timed etch is further controlled to stop prior to the poly fuse. Although not necessarily harmful to expose the poly fuse 14, in a preferred embodiment, the dielectric over the poly fuse 14 is left in order to provide a semiconductor device with a greater degree of predictability.

Figure 10:
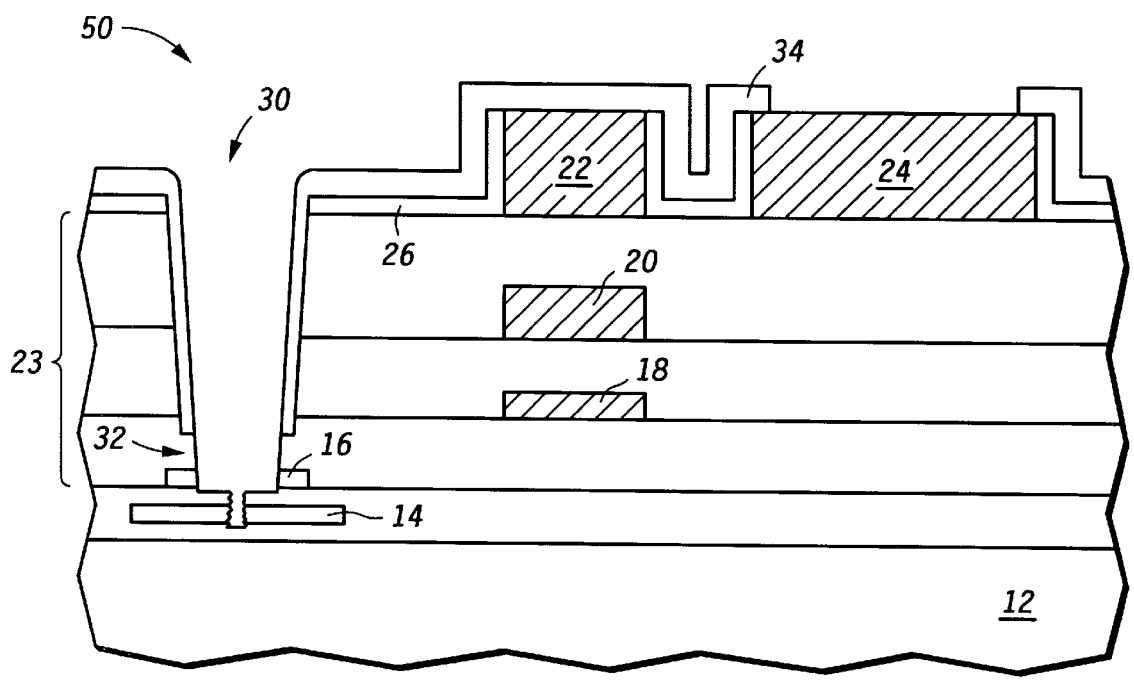
FIG. 10 illustrates in cross-sectional view the semiconductor device of FIG. 9 following the laser repair operation.

FIG. 10 illustrates the completed semiconductor device 50 following the blowing of the poly fuse 14. In one embodiment, the poly fuse 14 was blown either to remove a row or column of memory (not shown) from consideration due to a defect, or to add a row or column of memory in a memory device into use based upon the blowing of the fuse 14. The present invention allows for the appropriate exposure of the poly fuse 14 to the laser (not shown) such that the fuse may readily be blown. As previously discussed, the present invention utilizes a dielectric barrier layer 26 after formation of the metal structures 22 and 24, followed by the etching of the fuse cavity structure 30. The subsequent application of a passivation layer 34, then the etching of the fuse and pad cavities allows for greater reliability because a deep etch through the dielectric stack 23 can be performed as well as the much shallower etch through the passivation layer 34 to the pad 24 is performed in such a manner that the integrity of the passivation layer 34 over the metal line 22 is guaranteed. The prior art method would not guarantee the integrity of the metal three structure 22 in that the amount of time it took to etch through the stack 23 often also etched through the passivation layer and exposed the line or structure 22.

In the foregoing specification, the invention has been described with reference to specific embodiments. However, one of ordinary skill in the art appreciates that various modifications and changes can be made without departing from the scope of the present invention as set forth in the claims below. For example, the structures 22 and 24 have been described as being in third metal layer, it would be apparent to one skilled in the art that the structures 22 and 24 can be an any top conductive layer. As a further example, polysilicon has been used as an example throughout the specification, one skilled in the art will recognize that any silicon containing, or other conductive material could be substituted for the polysilicon. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A method for forming a cavity over a conductive element in an integrated circuit having a substrate, a first patterned conductive layer over the substrate including said conductive element and a second patterned conductive layer, and a first dielectric layer over the first patterned conductive layer, comprising the steps of:

forming a first mask over the first dielectric layer with an opening disposed over the conductive element;

etching partially through the first dielectric layer over the conductive element to leave a remaining portion of the first dielectric layer;

after etching partially through the first dielectric layer, depositing a second dielectric layer over the second patterned conductive forming a second mask with a first opening disposed over the conductive element; and after forming the second mask, etching through the remaining portion of the first dielectric layer to the second patterned conductive layer.

2. A method for forming a cavity for accessing a fuse in an integrated circuit having a substrate, comprising the steps of:

forming a first conductive layer with a fuse included therein over the substrate;

forming a multi-layered dielectric over the first conductive layer;

forming a patterned final metal layer on the multi-layered dielectric to have a bond pad, an interconnect, and an opening over the fuse;

forming a first mask over the multi-layered dielectric with an opening disposed over the fuse;

etching partially through the multi-layered dielectric over the fuse;

after etching partially through the multi-layered dielectric to leave a remaining portion of the multi-layered dielectric, depositing a passivation layer over the bond pad, the interconnect, and over the remaining portion of the multi-layered dielectric;

forming a second mask with openings disposed over the fuse and the bond pad but not over the interconnect; and etching through the passivation layer over the bond pad and over the remaining portion of the multi-layered dielectric but not over the interconnect.

3. The method of claim 2, wherein the step of forming the first conductive layer includes the first conductive layer containing silicon.

4. The method of claim 2 further comprising:

before forming the first mask, depositing a protective layer over the patterned final metal layer.

5. The method of claim 2 further comprising the step of blowing the fuse with a laser.

6. The method of claim 2 wherein the step of etching partially through the multi-layered dielectric over the fuse etches at least through 70% of the multi-layered dielectric.

7. The method of claim 2 further comprising the step of:

after the first conductive layer is formed, forming an interpoly dielectric and a second patterned conductive layer with an etch stop portion over the fuse.

8. The method of claim 7 further comprising the steps of:

after etching the passivation layer, etching through to the etch stop portion; and etching through the etch stop portion.

9. The method of claim 8 further comprising the steps of:

forming a first patterned metal layer after forming the second patterned conductive layer; and forming a second patterned metal layer after forming the first patterned metal layer.

10. The method of claim 2 further comprising the steps of:

forming a first patterned metal layer after forming the first conductive layer; and forming a second patterned metal layer after forming the first patterned metal layer.

11. A method for forming a cavity for blowing a fuse in an integrated circuit having a substrate, comprising the steps of:

forming a first conductive layer containing silicon with a fuse included therein over the substrate;

forming a first dielectric layer over the first conductive layer;

forming second conductive layer containing silicon with an etch stop portion over the fuse;

forming a multi-layered dielectric over the second conductive layer;

forming a patterned final metal layer over the multi-layered dielectric with an opening over the fuse;

forming a first mask over the multi-layered dielectric with an opening disposed over the etch stop portion;

etching partially through the multi-layered dielectric over the fuse;

after etching partially through the multi-layered dielectric to leave a remaining portion of the multi-layered dielectric, depositing a second dielectric layer over the patterned final metal layer;

forming a second mask with an opening disposed over the fuse;

etching through the remaining portion of the multi-layered dielectric to the etch stop portion; and etching through the etch stop portion.

12. The method of claim 11 further comprising:

before forming the second mask and after forming the first mask, depositing a protective layer over the patterned final metal layer.

13. The method of claim 12 further comprising:

forming a bond pad during the forming of the patterned final metal layer; and removing the protective layer from over the bond pad during the etching through the remaining portion of the multi-layered dielectric.

14. The method of claim 13 wherein the etching through the remaining portion of the multi-layered dielectric comprises:

removing the protective layer over the bond pad and a portion of the remaining portion of the multi-layered dielectric with a first etch chemistry; and then etching with a second etch chemistry to achieve etching through the remaining portion of the multi-layered dielectric to the etch stop portion.

15. The method of claim 11 further comprising the steps of:

forming a first patterned metal layer after forming the second conductive layer; and forming a second patterned metal layer after forming the first patterned metal layer.

16. A method for forming a cavity for blowing a fuse in an integrated circuit having a substrate, comprising the steps of:

forming a silicon containing layer with a fuse included therein over the substrate;

forming a multi-layered dielectric over the silicon containing layer;

forming a patterned final metal layer over the multi-layered dielectric with an opening over the fuse;

forming a first mask over the multi-layered dielectric with an opening disposed over the fuse;

etching partially through the multi-layered dielectric over the fuse;

after etching partially through the multi-layered dielectric to leave a remaining portion of the multi-layered dielectric, depositing a passivation layer over the patterned final metal layer and over the remaining portion of the multi-layered dielectric;

forming a second mask with an opening disposed over the fuse; and etching through the passivation layer over the remaining portion of the multi-layered dielectric.

17. The method of claim 16 further comprising:

before forming the first mask, depositing a protective layer over the patterned final metal layer.

18. The method of claim 16 further comprising:

forming a bond pad during the forming of the patterned final metal layer; and removing the passivation layer from over the bond pad during the etching through the passivation layer over the remaining portion of the multi-layered dielectric.

19. The method of claim 16 further comprising the step of blowing the fuse with a laser.

20. The method of claim 16 wherein the step of etching partially through the multi-layered dielectric over the fuse etches at least through 70% of the multi-layered dielectric.

* * * * *

UNITED STATES PATENT AND TRADEMARK OFFICE
CERTIFICATE OF CORRECTION

PATENT NO. : 6,054,340
DATED : April 25, 2000
INVENTOR(S) : Joel Mitchell et al

It is certified that error appears in the above-indentified patent and that said Letters Patent is hereby corrected as shown below:

On the title page: Item [75] Inventors:

Second inventor's name should be changed from "Fred Cumplan" to read Fred --Cumpian--.

Signed and Sealed this

Thirteenth Day of March, 2001

Attest:

NICHOLAS P. GODICI

Attesting Officer

Acting Director of the United States Patent and Trademark Office